United States Patent
Park et al.

(10) Patent No.: US 7,998,363 B2
(45) Date of Patent: Aug. 16, 2011

(54) ORGANIC ELECTROLUMINESCENCE DEVICE

(75) Inventors: Jong-Jin Park, Yongin-si (KR); Tae-Yong Noh, Gunpo-si (KR)

(73) Assignee: Samsung Mobile Display Co., Ltd., Giheung-Gu, Yongin, Gyunggi-Do (KR)

(*) Notice: Subject to any disclaimer, the term of this patent is extended or adjusted under 35 U.S.C. 154(b) by 1225 days.

(21) Appl. No.: 11/601,643

(22) Filed: Nov. 20, 2006

(65) Prior Publication Data

US 2007/0176148 A1 Aug. 2, 2007

(30) Foreign Application Priority Data

Jan. 27, 2006 (KR) .................. 10-2006-0009009

(51) Int. Cl.
C09K 11/06 (2006.01)
H01L 51/54 (2006.01)

(52) U.S. Cl. ............ 252/301.16; 252/301.35; 257/40; 257/E51.047; 257/E51.048; 428/690; 428/917; 313/504

(58) Field of Classification Search .......... 428/690, 428/917; 252/301.16, 301.35; 257/40, E51.047, 257/E51.048; 313/504

See application file for complete search history.

(56) References Cited

U.S. PATENT DOCUMENTS

| 5,115,057 A * | 5/1992 | Ono et al. ............ 526/256 |
| 7,378,161 B2 * | 5/2008 | Han et al. ............ 428/690 |
| 2005/0162728 A1 * | 7/2005 | Warner et al. ......... 359/273 |
| 2006/0188662 A1 * | 8/2006 | Farrand et al. ......... 428/1.1 |
| 2006/0226396 A1 * | 10/2006 | Majumdar et al. ...... 252/500 |

FOREIGN PATENT DOCUMENTS

JP  2002-252089  9/2002

OTHER PUBLICATIONS

M. A. Baldo et al., "Excitonic singlet-triplet ratio in a semiconducting organic thin film", Physical Review B, vol. 60, No. 20, pp. 14 422-14 428, Nov. 15, 1999.

M. A. Baldo et al., "Highly efficient phosphorescent emission from organic electroluminescent devices", Nature, vol. 395, pp. 151-154, Sep. 10, 1998.

* cited by examiner

Primary Examiner — Angela Ortiz
Assistant Examiner — J. L. Yang
(74) Attorney, Agent, or Firm — Robert E. Bushnell, Esq.

(57) ABSTRACT

Provided are a light emitting layer including molten salt and an organic electroluminescent device comprising the light emitting layer. When the organic electroluminescent device is operated, a field induction charge separation layer is formed in the light emitting layer including the molten salt and thus, carrier injection is improved, thereby providing a light emitting layer having improved light emitting efficiency. An organic electroluminescent device including the light emitting layer has low operating voltage and long lifespan.

8 Claims, 2 Drawing Sheets

ORGANIC ELECTROLUMINESCENCE DEVICE

CROSS-REFERENCE TO RELATED PATENT APPLICATION AND CLAIM OF PRIORITY

This application claims the benefit of Korean Patent Application No. 10-2006-0009009, filed on Jan. 27, 2006, in the Korean Intellectual Property Office, the disclosure of which is incorporated herein in its entirety by reference.

BACKGROUND OF THE INVENTION

1. Field of the Invention

The present invention relates to a light emitting layer including molten salt and to an organic electroluminescence device including the light emitting layer and more particularly, to a light emitting layer including molten salt which forms a field induction charge separation layer when operated and thus, improves carrier injection, thereby providing improved light emitting efficiency, and to an organic electroluminescence device including the light emitting layer, having a low operating voltage and a long lifespan.

2. Description of the Related Art

Organic electroluminescent (EL) devices, which are active display devices, use the recombination of electrons and holes in a fluorescent or phosphorescent organic compound thin layer (hereinafter, referred to as 'organic layer') to emit light when current is applied thereto. Organic electroluminescent devices are lightweight, have wide viewing angles, produce high-quality images, and can be manufactured using simple processes. Organic electroluminescent devices also can produce moving images with high color purity while having low consumption power and low voltage. Accordingly, organic electroluminescent devices are suitable for portable electronic applications.

In general, an organic electroluminescent device includes an anode, a hole transport layer, an emission layer, an electron transport layer, and a cathode sequentially stacked on a substrate. The hole transport layer, the light emitting layer, and the electron transport layer are organic layers formed of organic compounds. The organic electroluminescent device may operate as follows. When a voltage is applied between the anode and the cathode, holes emitted by the anode move to the light emitting layer via the hole transport layer. Electrons are emitted by the cathode and move to the light emitting layer via the electron transport layer. In the light emitting layer, the carriers recombine to produce excitons. The excitons radiatively decay, emitting light corresponding to a band gap of the material used to form the light emitting layer.

Materials that can be used for forming the light emitting layer of the organic electroluminescent device are divided, according to the emission mechanism, into fluorescent materials using singlet excitons and phosphorescent materials using triplet-state excitons. The light emitting layer is formed by doping such fluorescent materials or phosphorescent materials themselves or by forming such fluorescent materials or phosphorescent materials on appropriate host materials. When electrons are excited, singlet excitons and triplet excitons are generated in a host in the generation ratio of 1:3 (Baldo, et al., Phys. Rev. B, 1999, 60, 14422).

When fluorescent materials are used to form the light emitting layer in the organic electroluminescent device, triplet excitons that are generated in the host cannot be used. However, when phosphorescent materials are used to form the light emitting layer, both singlet excitons and triplet excitons can be used, and thus, an internal quantum efficiency of 100% can be obtained (see Baldo et al., Nature, Vol. 395, 151-154, 1998). Accordingly, the use of phosphorescent materials brings higher light emitting efficiency than use of fluorescent materials.

However, although phosphorescent materials are used to improve light emitting efficiency, sufficient level of light emitting efficiency required in light emitting devices is not yet available. Accordingly, various methods to improve light emitting efficiency have been devised. For example, a method improving charge transport capacity using specific polymer materials optimizes the forming process of activated molecules performed by combining holes and electrons and thus, light emitting points are uniformly dispersed, thereby improving light emitting efficiency. A method to dispose a charge generation layer in a light emitting layer induces multiple wavelength light emission, instead of single wavelength light emission, and thus, light emitting efficiency can also be improved. In addition, electrical and physical properties between metals and organic layers are improved to control interfacial property and thus, light emitting efficiency can be improved. However, such methods have complicated processes, resulting in high costs and thus, sufficient level of light emitting efficiency required in light emitting devices can not be provided. Therefore, improvement of light emitting efficiency is still required.

SUMMARY OF THE INVENTION

The present invention provides a composition for forming a light emitting layer having improved light emitting efficiency.

The present invention also provides an improved light emitting layer for a display device.

The present invention also provides an organic electroluminescence device comprising the light emitting layer.

According to an aspect of the present invention, there is provided a composition for forming a light emitting layer including light emitting materials and molten salt.

Molten salt may be an imidazolium derivative having the structure represented by Formula 1 or Formula 2:

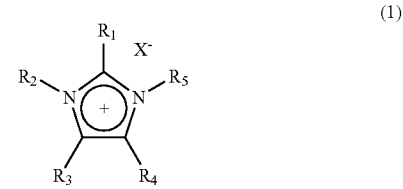

(1)

where $R_1$, $R_2$, $R_3$, $R_4$, and $R_5$ are each independently hydrogen, a halogen atom, a carboxyl group, an amino group, a nitro group, a cyano group, a hydroxy group, a substituted or unsubstituted $C_1$-$C_{20}$ alkyl group, a substituted or unsubstituted $C_1$-$C_{20}$ alkoxy group, a substituted or unsubstituted $C_1$-$C_{20}$ silicon containing group, a substituted or unsubstituted $C_1$-$C_{20}$ fluorine containing group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group; and X— is halide, borate-based anion, phosphate-based anion, phosphinate-based anion, imide-based anion, sulfonate-based anion, acetate-based anion, sulfate-based anion, cyanate-based anion, thiocyanate-based anion, carbon-based anion, complex anion, or $ClO_4^-$; and

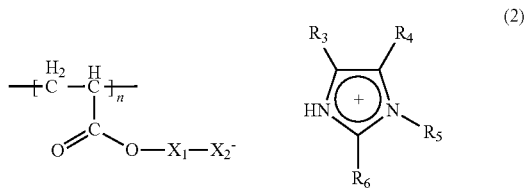

(2)

where $X_1$ is a substituted or unsubstituted $C_1$-$C_{10}$ alkylene group, a substituted or unsubstituted C6-C30 arylene group, a substituted or unsubstituted C1-C20 heteroalkylene group, or a substituted or unsubstituted C4-C30 heteroarylene group;

$X_2$ is sulfonate-based anion, cyanate-based anion, thiocyanate-based anion, and carboxylate-based anion;

$R_3$, $R_4$, $R_5$ and $R_6$ are each independently hydrogen, a halogen atom, a carboxyl group, an amino group, a nitro group, a cyano group, a hydroxy group, a substituted or unsubstituted $C_1$-$C_{20}$ alkyl group, a substituted or unsubstituted $C_1$-$C_{20}$ alkoxy group, a substituted or unsubstituted $C_1$-$C_{20}$ silicon containing group, a substituted or unsubstituted $C_1$-$C_{20}$ fluorine containing group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group; and n is an integer in a range of 50 to 500.

The amount of molten salt used may be 0.001 to 20% by weight based on a total weight of the light emitting materials used to form the light emitting layer.

According to another aspect of the present invention, there is provided an organic electroluminescence device including a pair of electrodes and a light emitting layer interposed between the pair of electrodes, the light emitting layer formed by coating and drying a composition, the composition comprising: light emitting material; and molten salt.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
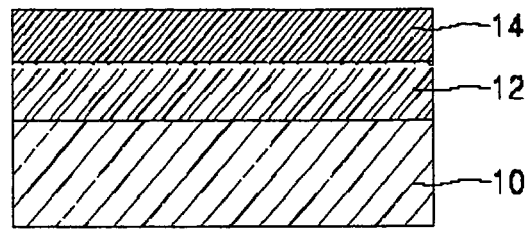
FIGS. 1A through 1F are diagrams schematically illustrating various laminated structures of an organic electroluminescent device according to embodiments of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Provided is a composition for forming a light emitting layer including light emitting materials and molten salt. Molten salt used in the light emitting layer is called ionic liquid (IL) and is referred to as salt having liquid properties at room temperature. Molten salt is generally formed of an organic cation and an inorganic or organic anion and has high evaporation temperature, high ionic conductivity, resistance to heat, and incombustibility. Molten salt is used in an organic synthetic solvent and a separation extraction solvent, and possibility of using the molten salt as an electrolyte of electrochemical devices such as a capacitor, a lithium ion battery and a fuel cell are currently on the rise.

In an embodiment of the present invention, such molten salt is used in the light emitting layer, especially in the light emitting layer of a displaying device such as an organic electroluminescent device to form a field induction charge separation layer on the interface between the light emitting layer and an adjacent layer when a voltage is applied, and thus, a carrier injection barrier is lowered, thereby lowering operating voltage and improving lifespan. In a conventional organic electroluminescent device, when a voltage is applied to an electrode layer, electrons and holes move and recombine in the light emitting layer to generate activated molecules. At this time, light is emitted from the activated molecules and desired display images can be formed. According to an embodiment of the present invention, molten salt is included in the light emitting layer to form a charge separation layer on the interface between the light emitting layer and an adjacent layer and thus, injection of electrons and holes is facilitated, while efficiency of forming activated molecules by recombining electrons and holes is increased, thereby improving light emitting efficiency of devices.

Molten salt may be any salt which can maintain its liquid characteristic at room temperature, for example, a material formed of a combination of an organic cation and an inorganic anion, or a material formed of a combination of an organic cation and an organic anion.

A cation of the molten salt according to the embodiments of the present invention may be at least one selected from the group consisting of substituted or unsubstituted imidazolium, substituted or unsubstituted pyrazolium, substituted or unsubstituted triazolium, substituted or unsubstituted thiazolium, substituted or unsubstituted oxazolium, substituted or unsubstituted pyridazinium, substituted or unsubstituted pyrimidinium, substituted or unsubstituted pyrazinium, substituted or unsubstituted ammonium, substituted or unsubstituted phosphonium, substituted or unsubstituted guanidinium, substituted or unsubstituted uronium, substituted or unsubstituted thiouronium, substituted or unsubstituted pyridinium, and substituted or unsubstituted pyrrolidinium, and more preferably substituted or unsubstituted imidazolium or pyridinium.

More specifically, a cation of a molten salt may be at least one selected from the group consisting of 1,3-dimethylimidazolium, 1-butyl-3-methylimidazolium, 1-ethyl-3-methylimidazolium, 1-hexadecyl-3-methylimidazolium, 1-hexyl-3-methylimidazolium, 3-methyl-1-octadecylimidazolium, 3-methyl-1-octylimidazolium, 3-methyl-tetradecylimidazolium, 1-butyl-2,3-dimethylimidazolium, 1-ethyl-2,3-dimethylimidazolium, 1-hexadecyl-2,3-dimethylimidazolium, 1-hexyl-2,3-dimethylimidazolium, 1,2,3-trimethylimidazolium; N-hexylpyridinium, N-butyl-3,4-dimethylpyridinium, N-butyl-3,5-dimethylpyridinium, N-butyl-3-methylpyridinium, N-butyl-4-methylpyridinium, N-butylpyridinium, N-ethylpyridinium, N-hexylpyridinium, N-octylpyridinium; 1,1-dimethylpyrrolidinium, 1-butyl-1-methylpyrrolidinium, 1-hexyl-1-methylpyrrolidinium, 1-methyl-1-octylpyrrolidinium; trihexyl(tetradecyl)phosphonium; methyltrioctylammonium, ethyl-dimethyl-propylammonium; guanidinium, N''-ethyl-N,N,N',N'-tetramethylguanidinium; O-ethyl-N,N,N',N'-tetramethylisouronium; and S-ethyl-N,N,N',N'-tetramethylisothiouronium, but are not limited thereto.

An anion which forms the molten salt by combining with the cation described above is any organic or inorganic anion and may be at least one selected from the group consisting of halide, a borate-based anion, a phosphate-based anion, a phosphinate-based anion, an imide-based anion, a sulfonate-based anion, an acetate-based anion, a sulfate-based anion, a cyanate-based anion, a thiocyanate-based anion, a carbon-based anion, a complex anion, and $ClO_4^-$.

More specifically, an anion may be at least one selected from the group consisting of $PF_6^-$, $BF_4^-$, $B(C_2O_4)^-$, $CH_3(C_6H_5)SO_3^-$, $(CF_3CF_2)_2PO_2^-$, $CF_3SO_3^-$, $CH_3SO_4^-$, $CH_3(CH_2)_7SO_4^-$, $N(CF_3SO_2)_2^-$, $N(C_2F_5SO_2)_2^-$, $C(CF_2SO_2)_3^-$, $AsF_6^-$, $SbF_6^-$, $AlCl_4^-$, $NbF_6^-$, $HSO_4^-$, $ClO_4^-$, $CH_3SO_3^-$, and $CF_3CO_2^-$.

According to an embodiment of the present invention, the molten salt comprised of a cation and an anion which can be combined together may be represented by Formula 1.

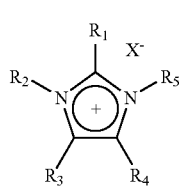

<Formula 1> where $R_1$, $R_2$, $R_3$, $R_4$, and $R_5$ are each independently hydrogen, a halogen atom, a carboxyl group, an amino group, a nitro group, a cyano group, a hydroxy group, a substituted or unsubstituted $C_1$-$C_{20}$ alkyl group, a substituted or unsubstituted $C_1$-$C_{20}$ alkoxy group, a substituted or unsubstituted $C_1$-$C_{20}$ silicon containing group, a substituted or unsubstituted $C_1$-$C_{20}$ fluorine containing group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group; and X— is halide, a borate-based anion, a phosphate-based anion, a phosphinate-based anion, an imide-based anion, a sulfonate-based anion, an acetate-based anion, a sulfate-based anion, a cyanate-based anion, a thiocyanate-based anion, a carbon-based anion, a complex anion, or $ClO_4^-$.

Examples of the molten salt of Formula 1 are 1,3-dimethylimidazolium trifluoromethane sulfonate, 1-butyl-3-methylimidazolium bromide, 1-butyl-3-methylimidazolium chloride, 1-butyl-3-methylimidazolium hexafluorophosphate, 1-butyl-3-methylimidazolium hexafluorophosphate, 1-butyl-3-methylimidazolium iodide, 1-butyl-3-methylimidazolium methylsulfate, 1-butyl-3-methylimidazolium octylsulfate, 1-butyl-3-methylimidazolium tetrafluoroborate, 1-butyl-3-methylimidazolium trifluoromethane sulfonate, 1-butyl-3-methylimidazolium trifluoroacetate, 1-ethyl-3-methylimidazolium bis[oxalato]borate, 1-ethyl-3-methylimidazolium bromide, 1-ethyl-3-methylimidazolium chloride, 1-ethyl-3-methylimidazolium hexafluorophosphate, 1-ethyl-3-methylimidazolium methylsulfate, 1-ethyl-3-methylimidazolium p-toluenesulfonate, 1-ethyl-3-methylimidazolium tetrafluoroborate, 1-ethyl-3-methylimidazolium thiocyanate, 1-ethyl-3-methylimidazolium trifluoromethane sulfonate, 1-ethyl-3-methylimidazolium trifluoroacetate, 1-ethyl-3-methylimidazolium bis(pentafluoroethyl)phosphinate, 1-hexadecyl-3-methylimidazolium chloride, 1-hexyl-3-methylimidazolium bis(trifluoromethylsulfonyl)imide, 1-hexyl-3-methylimidazolium chloride, 1-hexyl-3-methylimidazolium hexafluorophosphate, 1-hexyl-3-methylimidazolium tetrafluoroborate, 1-hexyl-3-methylimidazolium tri(pentafluoroethyl)trifluorophosphate, 3-methyl-1-octadecylimidazolium bis(trifluorosulfonyl)imide, 3-methyl-1-octadecylimidazolium hexafluorophosphate, 3-methyl-1-octadecylimidazolium tri(pentafluoroethyl)trifluorophosphate, 3-methyl-1-octylimidazolium bis(trifluoromethylsulfonyl)imide, 3-methyl-1-octylimidazolium chloride, 3-methyl-1-octylimidazolium hexafluorophosphate, 3-methyl-1-octylimidazolium octylsulfate, 3-methyl-1-octylimidazolium tetrafluoroborate, 3-methyl-1-tetradecylimidazolium tetrafluoroborate, 1-propyl-3-methylimidazolium iodide; 1-butyl-2,3-dimethylimidazolium chloride, 1-butyl-2,3-dimethylimidazolium hexafluorophosphate, 1-butyl-2,3-dimethylimidazolium iodide, 1-butyl-2,3-dimethylimidazolium octylsulfate, 1-butyl-2,3-dimethylimidazolium tetrafluoroborate, 1-ethyl-2,3-dimethylimidazolium bromide, 1-ethyl-2,3-dimethylimidazolium chloride, 1-ethyl-2,3-dimethylimidazolium hexafluorophosphate, 1-ethyl-2,3-dimethylimidazolium p-toluenesulfonate, 1-ethyl-2,3-dimethylimidazolium tetrafluoroborate, 1-hexadecyl-2,3-dimethylimidazolium chloride, 1-hexyl-2,3-dimethylimidazolium chloride, and 1,2,3-trimethylimidazolium iodide.

Other examples of the molten salt are N-hexylpyridinium bis(trifluoromethylsulfonyl)imide, N-butyl-3,4-dimethylpyridinium chloride, N-butyl-3,5-dimethylpyridinium chloride, N-butyl-3-methylpyridinium chloride, N-butyl-4-methylpyridinium bromide, N-butyl-4-methylpyridinium chloride, N-butyl-4-methylpyridinium hexafluorophosphate, N-butyl-4-methylpyridinium tetrafluoroborate, N-butylpyridinium chloride, N-butylpyridinium hexafluorophosphate, N-butylpyridinium trifluoromethane sulfonate, N-ethylpyridinium bromide, N-ethylpyridinium chloride, N-hexylpyridinium hexafluorophosphate, N-hexylpyridinium tetrafluoroborate, N-hexylpyridinium trifluoromethane sulfonate, N-octylpyridinium chloride; 1,1-dimethylpyrrolidinium iodide, 1-butyl-1-methylpyrrolidinium bis(trifluoromethylsulfonyl)imide, 1-butyl-1-methylpyrrolidinium chloride, 1-butyl-1-methylpyrrolidinium hexafluorophosphate, 1-butyl-1-methylpyrrolidinium tetrafluoroborate, 1-butyl-1-methylpyrrolidinium trifluoroacetate, 1-butyl-1-methylpyrrolidinium trifluoromethane sulfonate, 1-butyl-1-methylpyrrolidinium tri(pentafluoroethyl)trifluorophosphate, 1-butyl-1-methylpyrrolidinium bis[oxalato(2-)]borate, 1-hexyl-1-methylpyrrolidinium chloride, 1-methyl-1-octylpyrrolidinium chloride; trihexyl(tetradecyl)phosphonium bis(trifluoromethylsulfonyl)imide, trihexyl(tetradecyl)phosphonium bis[oxalato(2-)]-borate, trihexyl(tetradecyl)phosphonium chloride, trihexyl(tetradecyl)phosphonium hexafluorophosphate, trihexyl(tetradecyl)phosphonium tetrafluoroborate, trihexyl(tetradecyl)phosphonium tri(pentafluoroethyl)trifluorophosphate, 1-hexyl-3-methylimidazoliumtris(pentafluoride ethyl)trifluorophosphate, 1-butyl-3-methylimidazoliumtris(pentafluoride ethyl)trifluorophosphate, 1-butyl-3-methylimidazoliumhexafluorophosphate; methyltrioctylammonium bis(trifluoromethylsulfonyl)imide, methyltrioctylammonium trifluoroacetate, methyltrioctylammonium trifluoromethane sulfonate, ethyl-dimethyl-propylammonium bis(trifluoromethylsulfonyl)imide; guanidinium trifluoromethane sulfonate, guanidinium tri(pentafluoroethyl)trifluorophosphate, N''-ethyl-N,N,N',N'-tetramethylguanidinium trifluoromethane sulfonate, N''-ethyl-N,N,N',N'-tetramethylguanidinium tri(pentafluoroethyl)trifluorophosphate; O-ethyl-N,N,N',N'-tetramethylisouronium trifluoromethane sulfonate, O-ethyl-N,N,N',N'-tetramethylisouronium tri(pentafluoroethyl)trifluorophosphate, S-ethyl-N,N,N',N'-tetramethyl-isothiouronium trifluoromethane sulfonate, and S-ethyl-N,N,N',N'-tetramethylisouronium tri(pentafluoroethyl)trifluorophosphate.

According to an embodiment of the present invention, the molten salt may be a polymer molten salt represented by Formula 2.

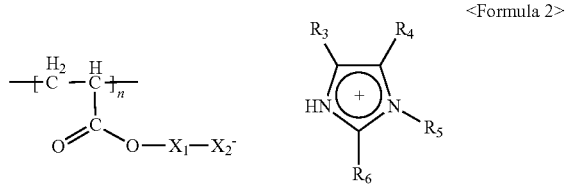

<Formula 2> where $X_1$ is a substituted or unsubstituted $C_1$-$C_{10}$ alkylene group, a substituted or unsubstituted $C_6$-$C_{30}$ arylene group, a substituted or unsubstituted $C_1$-$C_{20}$ heteroalkylene group, or a substituted or unsubstituted $C_4$-$C_{30}$ heteroarylene group;

$X_2$ is a sulfonate-based anion, a cyanate-based anion, a thiocyanate-based anion, and a carboxylate-based anion;

$R_3$, $R_4$, $R_5$ and $R_6$ are each independently hydrogen, a halogen atom, a carboxyl group, an amino group, a nitro group, a cyano group, a hydroxy group, a substituted or unsubstituted $C_1$-$C_{20}$ alkyl group, a substituted or unsubstituted $C_1$-$C_{20}$ alkoxy group, a substituted or unsubstituted $C_1$-$C_{20}$ silicon containing group, a substituted or unsubstituted $C_1$-$C_{20}$ fluorine containing group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group; and n is an integer in a range of 50 to 500.

The compound of Formula 2 is a polymer molten salt in an average number of molecular weight of 1,000 to 30,000. The polymer molten salt can be manufactured using dipolymer and terpolymer which are copolymerized with other polymers.

The term "substituted" used when defining the compound above indicates that at least one hydrogen atom which exists in the compound is each independently substituted with an appropriate substituent and examples of the substituent are a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group.

An alkyl group which can be used in the embodiments of the present invention (e.g., $R_1$-$R_5$ of Formula 1 and $R_3$-$R_6$ of Formula 2) may be a straight-chain type or a branched-chain type $C_1$-$C_{20}$ alkyl group, more preferably, a straight-chain type or a branched-chain type $C_1$-$C_{12}$ alkyl group, most preferably, a straight-chain type or a branched-chain type $C_1$-$C_6$ alkyl group. Examples of such an alkyl group are methyl, ethyl, n-propyl, isopropyl, n-butyl, isobutyl, sec-butyl, t-butyl, pentyl, isoamyl, and hexyl. One or more hydrogen atoms included in the alkyl group can be further substituted with a halogen atom and thus, a haloalkyl group may be formed.

An alkoxy group which can be used in the embodiments of the present invention (e.g., $R_1$—$R_5$ of Formula 1 and $R_3$—$R_6$ of Formula 2) may be oxygen containing straight-chain type or a branched-chain type $C_1$-$C_{20}$ alkoxy group, each having an alkyl moiety, more preferably, a $C_1$-$C_6$ alkoxy group, for example, a $C_1$-$C_3$ alkoxy group. Examples of such an alkoxy group are methoxy, ethoxy, propoxy, butoxy, and t-butoxy. The alkoxy group can be further substituted with one or more halogen atoms such as fluoro, chloro, or bromo and thus, a haloalkoxy group may be formed. Such examples are fluoromethoxy, chloromethoxy, trifluoromethoxy, trifluoroethoxy, fluoroethoxy, and fluoropropoxy.

An alkenyl group which can be used in the embodiments of the present invention (e.g., $R_1$-$R_5$ of Formula 1 and $R_3$-$R_6$ of Formula 2) may be a straight-chain type or a branched-chain type $C_2$-$C_{20}$ aliphatic hydrocarbon group having a carbon-carbon double bond. The alkenyl group may have 2 to 12 carbon atoms in the chain thereof, and more preferably, 2 to 6 carbon. A branched-chain type indicates that one or more lower alkyl or lower alkenyl groups are attached to the straight chain of alkenyl. The alkenyl group may be unsubstituted or independently substituted using, but not limited to, at least one group including halo, carboxy, hydroxy, formyl, sulfo, sulfino, carbamoyl, amino and imino. Examples of such alkenyl groups are ethenyl, prophenyl, carboxyethenyl, carboxyprophenyl, sulfinoethenyl, and sulfonoethenyl.

An alkynyl group which can be used in the embodiments of the present invention (e.g., $R_1$-$R_5$ of Formula 1 and $R_3$-$R_6$ of Formula 2) may be a straight-chain type or a branched-chain type $C_2$-$C_{20}$ aliphatic hydrocarbon group having carbon-carbon triple bond. The alkynyl group may have 2 to 12 carbon atoms in the chain thereof, and more preferably, 2 to 6 carbon atoms. A branched-chain type indicates that one or more lower alkyl or lower alkynyl group is attached in the straight chain of alkynyl. The alkynyl group may be unsubstituted or independently substituted using, but not limited to, at least one of the group including halo, carboxy, hydroxy, formyl, sulfo, sulfino, carbamoyl, amino and imino.

A heteroalkyl group which can be used in the embodiments of the present invention (e.g., $R_1$-$R_5$ of Formula 1 and $R_3$-$R_6$ of Formula 2) may have 1 to 20 carbon atoms in the alkyl group, more preferably, 1 to 12 carbon atoms, and for example, 1 to 6 hetero atoms such as N, O, P, and S in the main chain.

An aryl group which can be used in the embodiments of the present invention (e.g., $R_1$—$R_5$ of Formula 1 and $R_3$—$R_6$ of Formula 2) is used independently or in combination and may be a $C_6$-$C_{30}$ carbocyclic aromatic system including one or more rings. The rings may be attached or fused together using a pendent method. The term "aryl" includes aromatic radicals such as phenyl, naphthyl, tetrahydro naphthyl, indane, and biphenyl, for example, phenyl. Such an aryl group may have 1 to 3 substituents such as hydroxy, halo, haloalkyl, nitro, cyano, alkoxy, and low alkylamino.

An arylalkyl group which can be used in the embodiments of the present invention (e.g., $R_1$-$R_5$ of Formula 1 and $R_3$-$R_6$ of Formula 2) indicates that one or more hydrogen atoms included in the alkyl group is substituted with the aryl group.

A heteroarylalkyl group which can be used in the embodiments of the present invention (e.g., $R_1$-$R_5$ of Formula 1 and $R_3$-$R_6$ of Formula 2) indicates that one or more hydrogen atoms included in the alkyl group is substituted with the heteroaryl group and is a $C_3$-$C_{30}$ carbocyclic aromatic system.

In the compounds of Formulas 1 and 2, the heteroaryl group may include 1, 2, or 3 hetero atoms selected from N, O, and S and indicates a $C_5$-$C_{30}$ monovalent monocyclic or bicyclic aromatic radical in which residual ring atoms are C. In addition, the heteroaryl group indicates that hetero atoms included in the rings are oxidized or quaternized, for example, a monovalent monocyclic or bicyclic aromatic radical which forms an N-oxide or a quaternary salt. Examples are thienyl, benzothienyl, pyridyl, pyrazinyl, pyrimidinyl, pyridazinyl, quinolinyl, quinoxalinyl, imidazolyl, furanyl, benzofuranyl, thiazolyl, isoxazoline, benzisoxazoline, benzimidazolyl, triazolyl, pyrazolyl, pyrrolyl, indolyl, 2-pyridonyl, N-alkyl-2-pyridonyl, pyrazinonyl, pyridazinonyl, pyrimidinonyl, oxazolonyl, an N-oxide corresponding thereof (for example, pyridyl N-oxide, quinolinyl N-oxide), and the fourth salt thereof, but are not limited thereto.

The above described molten salt according to the embodiments of the present invention can be used independently when forming a light emitting layer, but preferably, such a molten salt may be first mixed with a polar solvent such as dimethylformamide (DMF), tetrahydrofuran (THF), (dimethyl acetoamide) DMAc, 1,4-dioxane, ethylene carbonate, and acetone, before being used. When mixing with a polar solvent, the amount of molten salt may be 0.001 to 50 parts by weight based on 100 parts by weight of the polar solvent, more preferably, 0.01 to 30 parts by weight, most preferably, 0.1 to 10 parts by weight. When the amount of molten salt is below 0.001 parts by weight, the amount is too small and thus, desired effects cannot be achieved. When the amount of molten salt is above 50 parts by weight, a quenching effect may occur between molten salts.

The molten salt dissolved in the polar solvent is mixed with light emitting materials to form a light emitting layer. The amount of the molten salt or mixture solution of the molten salt and the polar solvent may be 0.001 to 20% by weight based on a total weight of forming materials for the light emitting layer, preferably, 0.1 to 10% by weight. When the amount is below 0.001% by weight, the amount of molten salt is too small to achieve desired effect. When the amount is above 20% by weight, the quenching effect may occur due to an excessive amount.

The materials used to form the light emitting layer can be any fluorescent or phosphorescent materials conventionally used, but may further include at least one host selected from the group consisting of one or more kinds of polymer host, a mixture host of a polymer and a small molecule, a small molecule host, and a non-emitting polymer matrix. Here, for polymer host, small molecule host, and non-emitting polymer matrix, any materials conventionally used in forming a light emitting layer for organic electroluminescent devices can be used. Examples of the polymer host may be, but are not limited to, poly(vinylcarbazole) (PVK), polyfluorene, poly (p-phenylene vinylene), polythiophene, and the like. Examples of the small molecule host may be, but are not limited to, CBP(4,4'-N,N'-dicarbazole-biphenyl), 4,4'-bis[9-(3,6-biphenylcarbazolyl)]-1,1'-biphenyl, 9,10-bis[(2',7'-t-butyl)-9',9"-spirobifluorenyl anthracene, tetrafluorene, and the like. Examples of the non-emitting polymer matrix may be, but are not limited to, polymethylmethacrylate, polystyrene, and the like.

The light emitting layer may be formed using various methods such as vacuum depositing, sputtering, printing, coating, and ink jetting.

The light emitting layer according to the embodiments of the present invention may be used in various displaying devices and more particularly in organic electroluminescent devices.

FIGS. 1A through 1F are diagrams schematically illustrating various laminated structures of an organic electroluminescent (EL) device according to embodiments of the present invention.

Referring to FIG. 1A, an organic electroluminescent device according to an embodiment of the present invention comprises a light emitting layer 12 having molten salt laminated on a first electrode 10 and a second electrode 14 formed on the light emitting layer 12.

Figure 1B:
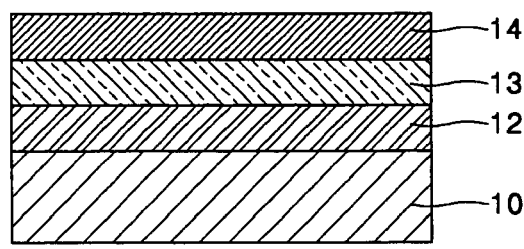

Referring to FIG. 1B, the organic electroluminescent device according to another embodiment of the present invention comprises a light emitting layer 12 having molten salt laminated on a first electrode 10, a hole blocking layer (HBL) 13 laminated on the light emitting layer 12, and a second electrode 14 formed on the HBL 13.

Figure 1C:
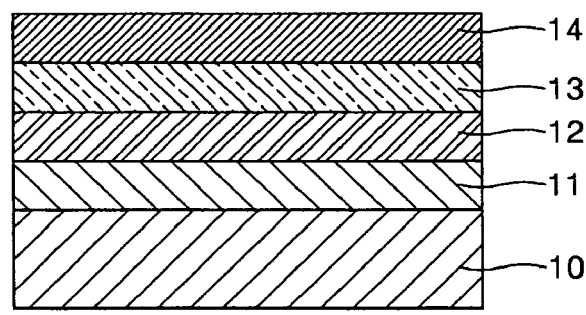

Referring to FIG. 1C, the organic electroluminescent device according to another embodiment of the present invention has the same structure as the embodiment shown in FIG. 1B except that a hole injection layer (HIL) 11 is further formed between the first electrode 10 and the light emitting layer 12.

Figure 1D:
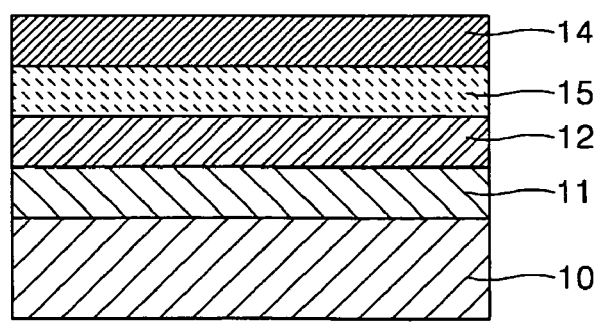

Referring to FIG. 1D, the organic electroluminescent device according to another embodiment of the present invention has the same structure as the embodiment shown in FIG. 1C except that an electron transport layer (ETL) 15 is formed on the light emitting layer 12, instead of the HBL 13.

Figure 1E:
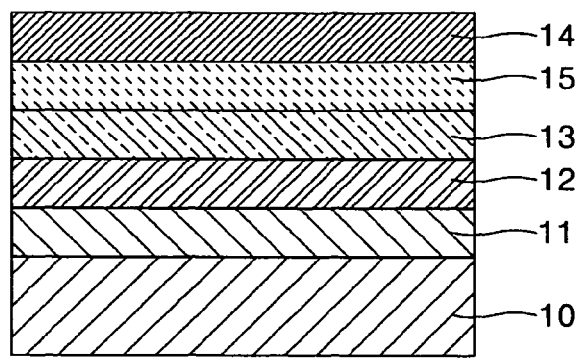

Referring to FIG. 1E, the organic electroluminescent device according to another embodiment of the present invention has the same structure as the embodiment shown in FIG. 1C except that two layers which include the HBL 13 and the ETL 15 instead of the single layered HBL 13 is formed on the light emitting layer 12 having molten salt, wherein the HBL 13 and the ETL 15 are sequentially laminated on the light emitting layer 12. In some cases, in FIG. 1E, an electron injection layer may be further formed between the ETL 15 and the second electrode 14.

Figure 1F:
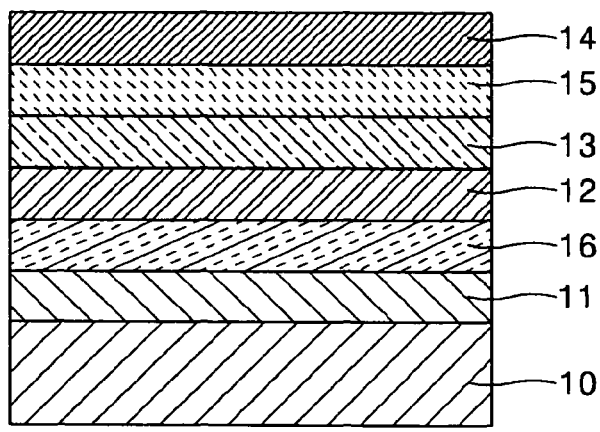

Referring to FIG. 1F, the organic electroluminescent device according to another embodiment of the present invention has the same structure as the embodiment shown in FIG. 1E except that a hole transport layer 16 is further formed between the HIL 11 and the light emitting layer 12. The hole transport layer 16 prevents impurities from penetrating into the light emitting layer 12 from the HIL 11.

The organic EL device having the laminated structures described above may be formed using conventional manufacturing methods, and the structures thereof are not particularly restricted.

The thickness of the light emitting layer may be in a range of 30 to 100 nm. When the thickness of the light emitting layer is below 30 nm, efficiency and lifetime thereof are reduced. When the thickness of the light emitting layer is above 100 nm, operating voltage increases.

In the organic EL device, a buffer layer may be interposed between layers. The buffer layer may be formed of any materials used conventionally, for example, copper phthalocyanine, polythiophene, polyaniline, polyacetylene, polypyrrole, polyphenylene vinylene, or the derivatives thereof, but is not limited thereto.

The HTL may be formed of any materials used conventionally, for example, polytriphenylamine, but is not limited thereto.

The ETL may be formed of any materials used conventionally, for example, polyoxadiazole, but is not limited thereto.

The HBL may be formed of any materials used conventionally, for example, LiF, $BaF_2$, or $MgF_2$, but is not limited thereto.

In the manufacture of the organic EL device of the embodiment of the present invention, special equipment and method are not required. The organic EL device can be manufactured according to the conventional manufacturing method using light emitting materials.

Light emitting diodes including the light emitting layer in which molten salt of the embodiment of the present invention is included can be used in light source illuminations for full-color displays, back lights, outdoor billboards, optical communication, and interior decoration The present invention will now be described in greater detail with reference to the following examples. The following examples are for illustrative purposes and are not intended to limit the scope of the invention.

MANUFACTURING EXAMPLE 1

Manufacturing Molten Salt Polymer

1) Manufacture of Molten Salt Monomer

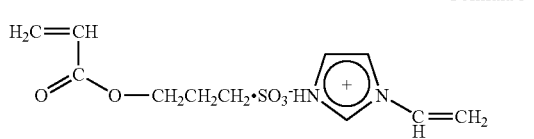

<Formula 3>

A hydrogen substitution reaction was performed on 3-sulfopropylacrylate potassium salt using a cation exchange resin (product name: Amberlite IR-120B H AG). An acid of the reactant was gradually mixed with 1-vinyl imidazole having same mole number in an ice bath. The mixture was stirred for 24 hours at room temperature and allowed to react. Then, after water-soluble materials were dried using a rotating evaporator, residual viscosity liquid was mixed with moisture-free diethylether and stirred for 2 hours. The viscosity liquid was repeatedly filtered and dried, and dried by decompression drying to manufacture molten salt.

2) Manufacture of Molten Salt Polymer 1 mol % of α,α'-(azobis(isobutyronitrile)) (AIBN) was dissolved in a polymerization ampoule with ethanol using monomer and initiator obtained from the 1) Manufacture molten salt monomer described above and was compressed to remove air, followed by radical polymerization at 60° C. for 24 hours. The polymeric composition was dissolved in an excessive amount of acetone and was precipitated in moisture-free methanol, followed by decompression drying at 60° C. Subsequently, molten salt polymer was obtained.

EXAMPLE 1

0.05 g of 1-ethyl-3-methylimidazolium chloride (Merck Inc.) was added to 7 ml of DMF to prepare a molten salt mixture solution. Then, an amount of the molten salt mixture solution was added to green 223 polymer (Dow Inc.) to manufacture a composition for forming a light emitting layer wherein the amount of molten salt used is 1% by weight based on a total weight of the composition for forming a light emitting layer.

EXAMPLE 2

0.04 g of polymer molten salt obtained from Manufacturing Example 1 was added to 7 ml of DMF to prepare a molten salt mixture solution. Then, an amount of the molten salt mixture solution was added to green 223 polymer (Dow Inc.) to manufacture a composition for forming a light emitting layer wherein the amount of molten salt used is 5% by weight based on a total weight of the composition for forming a light emitting layer.

Manufacture of Organic Electroluminescent (EL) Devices

EXAMPLE 3

An indium-tin oxide (ITO)-coated transparent electrode substrate was washed and an ITO electrode pattern was formed on the substrate using a photoresist resin and an etchant. The ITO electrode patterned substrate was again washed. PEDOT[poly(3,4-ethylenedioxythiophene)][AI 4083]-PSS was coated on the washed ITO electrode patterned substrate to a thickness of about 50 nm and baked at 120° C. for about 5 minutes to form a hole injection layer.

The composition for forming a light emitting layer obtained from Example 1 was spin coated on the hole injection layer and was baked at 100° C. for 1 hour. Then a solvent was completely removed in a vacuum oven to form a light emitting layer having a thickness of 80 nm.

Then, while maintaining a pressure of $4 \times 10^{-6}$ torr or less using a vacuum deposition device, LiF was vacuum deposited on the polymer light emitting layer to form an electron injection layer to a thickness of 5 nm.

Subsequently, Al was deposited at a speed of 10 Å/sec to form a cathode with a thickness of 200 nm and the resultant structure was encapsulated, thereby completing manufacture of an organic EL device. Here, the encapsulating process was performed by sealing the resultant structure of the Al deposition in a glove box in which BaO powder was present in a dry nitrogen gas atmosphere and final treating by a UV hardener.

Figure 2:
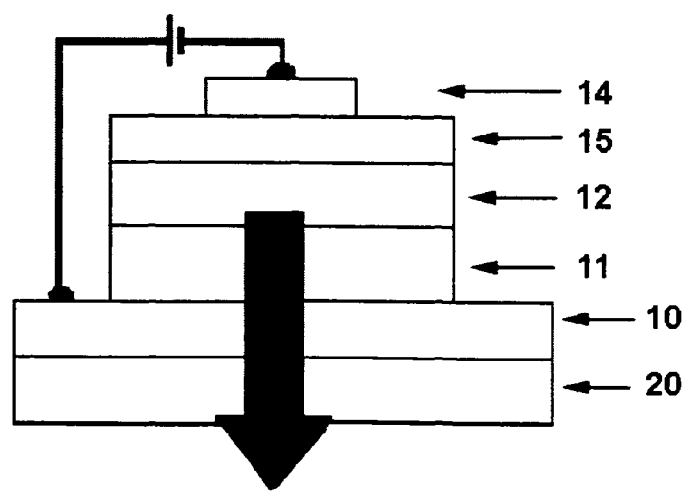
FIG. 2 is a diagram illustrating an organic electroluminescent device manufactured according to an embodiment of the present invention.

FIG. 2 is a diagram illustrating the organic EL device manufactured using the above described method according to an embodiment of the present invention. The organic EL device had a multi-layer structure and its schematic view is illustrated in FIG. 2. In this case, the light emitting area of the organic EL device was 6 $mm^2$.

EXAMPLE 4

An organic EL device was manufactured in the same manner as in Example 3, except that the composition for forming a light emitting layer obtained in Example 2 was used.

EXAMPLE 5

An indium-tin oxide (ITO)-coated transparent electrode substrate was washed and an ITO electrode pattern was formed on the substrate using a photoresist resin and an etchant. The ITO electrode patterned substrate was again washed. Then, while maintaining a pressure of $4 \times 10^{-6}$ torr or less using a vacuum deposition device, a-NPD which is a material for forming a hole transporting layer was vacuum deposited on the washed substrate to form an HTL with a thickness of 50 nm.

Aluminum(III) tris(8-hydroxyquinolate) (Alq$_3$) was vacuum deposited on the HTL using molten salt 1-ethyl-3-methylimidazolium chloride and green light emitting materials to form a light emitting layer having a thickness of 50 nm.

Then, Alq$_3$ was vacuum deposited on the light emitting layer at a speed of 1.0/sec to form an ETL having a thickness of 30 nm and LiF was vacuum deposited on the ETL to form an electron injection layer having a thickness of 5 nm.

Subsequently, Al was deposited at a speed of 10 Å/sec to form a cathode with a thickness of 200 nm and the resultant product was encapsulated, thereby completing manufacture of the organic EL device. Here, the encapsulating process was performed by sealing the resultant product of the Al deposition in a glove box in which BaO powder was present in a dry nitrogen gas atmosphere and final treating by a UV hardener.

The organic EL device had a multi-layer structure. A schematic view of the organic EL device is illustrated in FIG. 2. In this case, the light emitting area of the organic EL device was 6 mm$^2$.

COMPARATIVE EXAMPLE 1

An organic EL device was manufactured in the same manner as in Example 3, except that green 223 polymer was used in a light emitting layer was used, instead of molten salt.

COMPARATIVE EXAMPLE 2

An organic EL device was manufactured in the same manner as in Example 5, except that Alq$_3$ was used in a green light emitting layer, instead of molten salt.

COMPARATIVE EXAMPLE 3

An organic EL device was manufactured in the same manner as in Example 3, except that polymer molten salt was not used as in Example 4.

The operating voltage, light emitting efficiency, and lifespan of the organic electroluminescent (EL) devices obtained in Examples 3 and 4 and Comparative Examples 1 and 3 using a spin coating method and in Example 5 and Comparative Example 2 using a vacuum depositing are illustrated in Table 1.

TABLE 1

| | Spin coating method | | |
|---|---|---|---|
| | Operating voltage/Voltage at 100 cd/m$^2$ | Light emitting efficiency according to voltage (cd/A) | Life time |
| Example 3 | 2.4/3.0 | 9.8 at 6.2 V | 8500 hr@1000 cd/m$^2$ |
| Example 4 | 2.6/3.4 | 9.2 at 6.8 V | 9300 hr@1000 cd/m$^2$ |
| Comparative Example 1 | 3.1/4.8 | 8.1 at 8.2 V | 4200 hr@1000 cd/m$^2$ |
| Comparative Example 3 | 3.0/4.6 | 7.7 at 8.7 V | 5300 hr@1000 cd/m$^2$ |

TABLE 2

| | Vacuum depositing method | | |
|---|---|---|---|
| | Operating voltage/ Voltage at 100 cd/m$^2$ | Light emitting efficiency according to voltage (cd/A) | Life time |
| Example 5 | 2.2/3.0 | 21.2 at 6.3 V | 91 khr@1000 cd/m$^2$ |
| Comparative Example 2 | 3.1/4.2 | 12.9 at 6.8 V | 60 khr@1000 cd/m$^2$ |

As illustrated in Table 1 and Table 2, the organic electroluminescent (EL) devices of Examples 3 to 5 including the light emitting layer in which molten salt according to the embodiments of the present invention is included have low operating voltages and long life time.

When molten salt according to the embodiments of the present invention is used in a light emitting layer, a field induction charge separation layer is formed and thus, carrier injection is improved, thereby providing a light emitting layer having improved light emitting efficiency. An organic electroluminescent (EL) device using the light emitting layer has a low operating voltage and a long life time.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A composition for forming a light emitting layer, comprising:
light emitting material; and
molten salt,
wherein the molten salt is represented by Formula 2:

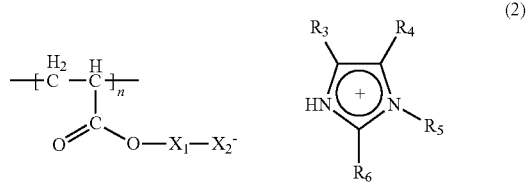

where X$_1$ is a substituted or unsubstituted C$_1$-C$_{10}$ alkylene group, a substituted or unsubstituted C6-C30 arylene group, a substituted or unsubstituted C1-C20 heteroalkylene group, or a substituted or unsubstituted C4-C30 heteroarylene group;

X$_2$ is sulfonate-based anion, cyanate-based anion, thiocyanate-based anion, or carboxylate-based anion;

R$_3$, R$_4$, R$_5$ and R$_6$ are each independently hydrogen, a halogen atom, a carboxyl group, an amino group, a nitro group, a cyano group, a hydroxy group, a substituted or unsubstituted C$_1$-C$_{20}$ alkyl group, a substituted or unsubstituted C$_1$-C$_{20}$ alkoxy group, a substituted or unsubstituted C$_1$-C$_{20}$ silicon containing group, a substituted or unsubstituted C$_1$-C$_{20}$ fluorine containing group, a substituted or unsubstituted C$_2$-C$_{20}$ alkenyl group, a substituted or unsubstituted C$_2$-C$_{20}$ alkynyl group, a substituted or unsubstituted C$_1$-C$_{20}$ heteroalkyl group, a substituted or unsubstituted C$_6$-C$_{30}$ aryl group, a substituted or unsubstituted C$_7$-C$_{30}$ arylalkyl group, a substituted or unsubstituted $C_5$-$C_{30}$ heteroaryl group, or a substituted or unsubstituted $C_3$-$C_{30}$ heteroarylalkyl group; and n is an integer in a range of 50 to 500.

2. The composition of claim 1, wherein the molten salt has an average number molecular weight of 1,000 to 30,000.

3. The composition of claim 1, wherein the amount of molten salt is 0.001 to 20% by weight based on a total weight of the light emitting material.

4. The composition of claim 1, wherein the light emitting material comprises at least one host selected from the group consisting of a polymer host, a mixture host of a polymer and a small molecule, a small molecule host, and a non-emitting polymer matrix.

5. The composition of claim 1, further comprising a polar solvent mixed with the molten salt.

6. A light emitting layer comprising the composition of claim 1.

7. An organic electroluminescent device comprising the light emitting layer of claim 6.

8. An organic electroluminescent device, comprising:

a first electrode;

a second electrode; and a light emitting layer interposed between the first electrode and the second electrode, the light emitting layer formed by coating and drying a composition, the composition comprising:

light emitting material; and molten salt wherein the molten salt is represented by Formula 2:

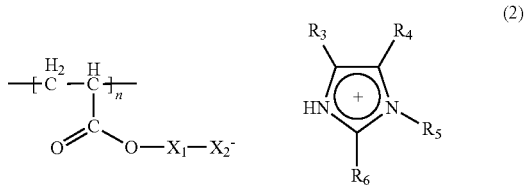

where $X_1$ is a substituted or unsubstituted $C_1$-$C_{10}$ alkylene group, a substituted or unsubstituted C6-C30 arylene group, a substituted or unsubstituted C1-C20 heteroalkylene group, or a substituted or unsubstituted C4-C30 heteroarylene group;

$X_2$ is sulfonate-based anion, cyanate-based anion, thiocyanate-based anion, or carboxylate-based anion;

$R_3$, $R_4$, $R_5$ and $R_6$ are each independently hydrogen, a halogen atom, a carboxyl group, an amino group, a nitro group, a cyano group, a hydroxy group, a substituted or unsubstituted $C_1$-$C_{20}$ alkyl group, a substituted or unsubstituted $C_1$-$C_{20}$ alkoxy group, a substituted or unsubstituted $C_1$-$C_{20}$ silicon containing group, a substituted or unsubstituted $C_1$-$C_{20}$ fluorine containing group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group; and n is an integer in a range of 50 to 500.

\* \* \* \* \*